United States Patent [19]

Ohiwa et al.

[11] Patent Number: 5,310,454
[45] Date of Patent: May 10, 1994

[54] DRY ETCHING METHOD

[75] Inventors: Tokuhisa Ohiwa, Kanagawa; Hisataka Hayashi, Chiba; Keiji Horioka, Kanagawa; Haruo Okano; Takaya Matsushita, both of Tokyo; Isahiro Hasegawa; Akira Takeuchi, both of Kanagawa, all of Japan

[73] Assignee: Kabushiki Kaisha Toshiba, Kanagawa, Japan

[21] Appl. No.: 26,042

[22] Filed: Mar. 4, 1993

[30] Foreign Application Priority Data

Mar. 4, 1992 [JP] Japan .................................. 4-047153
Mar. 27, 1992 [JP] Japan .................................. 4-071380

[51] Int. Cl.[5] .................... B44C 1/22; C03C 15/00; C03C 25/06
[52] U.S. Cl. .................... 156/643; 156/657; 156/659.1; 252/79.1
[58] Field of Search ............. 156/643, 644, 646, 657, 156/659.1, 662; 252/79.1; 204/192.32, 192.37

[56] References Cited

U.S. PATENT DOCUMENTS 4,283,249 8/1981 Ephrath .................... 156/643
4,462,863 7/1984 Nishimatsu et al. ........ 156/643
4,666,555 5/1987 Tsang .................... 156/643

OTHER PUBLICATIONS

Selective Etching of Silicon Dioxide Using Reactive Ion Etching with $CF_4-H_2$, L. M. Ephrath, J. Electrochem. Soc., 126:1419-1421 (1979).
Control of Relative Etch Rates of $SiO_2$ and Si in Plasma Etching, Heinecke, Solid State Electronics, 18:1146-1147 (1975).

Primary Examiner—William Powell
Attorney, Agent, or Firm—Finnegan, Henderson Farabow, Garrett & Dunner

[57] ABSTRACT

A dry etching method by a plasma etching forms a mask pattern, having an opening up to 1 μm width on a silicon oxide layer formed on a silicon substrate. The substrate is laced into a reactive chamber having an etching gas introducing means and fluorocarbon gas and hydrogen gas as the etching gas are introduced such that a ratio of the hydrogen gas to the gas mixture satisfies 50% to 80%. The plasma is generated, and by using the plasma etching, the silicon oxide layer is etched according to the mask pattern to form an opening having an aspect ratio of more than 1 in the silicon oxide layer.

9 Claims, 11 Drawing Sheets

DRY ETCHING METHOD

BACKGROUND OF THE INVENTION

1. Field of the Invention

The present invention relates to a dry etching method, and more particularly, to a reactive ion etching (RIE) method.

2. Description of the Related Art

The RIE method conventionally is used as a dry etching method for various materials. In manufacturing a semiconductor device, for example, the RIE method is used for etching a material of an electrode, such as a polysilicon or an $SiO_2$ layer. The RIE method is used because it can form a very accurate pattern in materials used in manufacturing semiconductor devices.

The RIE method is performed as described below. First, a substrate having a layer to be etched thereon is placed in a vacuum chamber having a pair of parallel plate electrodes. Second, an etching gas that will etch the layer but not the substrate is introduced into the chamber. The etching gas is discharged by applying a high frequency electric power to the parallel electrodes. As a result, the layer is etched by a gas plasma generated from the discharged gas.

Besides the RIE method, a plasma etching method, an Electron Cycrotron Resonance (ECR) type dry etching, an ion beam etching method, and a photo excited etching method are known as dry etching methods. These etching methods are similar to the RIE method with regard to chemically or physically etching the etching materials. In these etching methods, a gas containing fluorine and carbon elements, such as $C_2F_6$, $CF_4$, or $CHF_3$ are used for etching a silicon oxide layer.

According to the following steps, etching of an $SiO_2$ layer is performed and a contact hole is formed for connecting electrodes or wires in a semiconductor device such as a dynamic RAM (DRAM). If $CHF_3$ gas is used as an etching gas to etch a contact hole or a via hole in an $SiO_2$ layer on an Si substrate, $CF_3$ radicals ($CF_3$) are absorbed on the surface of the $SiO_2$ layer. The $CF_3$ absorbed on the surface are dissociated into C and F by an ion attack. As a result, C reacts with O in the $SiO_2$ layer to form CO gas and F reacts with Si in the $SiO_2$ layer form $SiF_4$ gas.

The F contained in the $CF_3$ absorbed on the surface of the Si substrate is extracted by H to form $CF_x$ ($x=0$, 1, 2, 3) as a polymer. The $CF_x$ polymers function to suppress the etching of the Si substrate. Accordingly, the selective etching of $SiO_2$ to the Si substrate can be achieved As the integration of a semiconductor device or circuit is increased, a high selectivity of $SiO_2$ etching to Si is required. Moreover, as the etching pattern size becomes miniaturized according to the increase of integration formation of a contact hole having a small width and a large aspect ratio, which is the ratio of hole depth to hole width, also is necessary. Unfortunately, the conventional etching methods have not been able to accurately etch high integration patterns.

One method to improve selectivity of $SiO_2$ to Si using $CF_4$ and $H_2$ as an etching gas was presented in "Selective Etching of Silicon Dioxide Using Reactive Ion Etching and $CF_4$-$H_2$", L. M. Ephrath, J. Electrochem. Soc., Vol. 124, No. 284, 1977. This RIE method was performed under conditions described below. A 150 W of a high frequency electric power was supplied to parallel plate electrodes provided in the etching chamber. A 40 m Torr of pressure and a 20 sccm (standard cubic centimeter per minute) of $CF_4$ gas was introduced into the chamber. The $H_2$ gas flow was changed and a gas mixture rate of $CF_4$ and $H_2$ was used to measure the etching rate of $SiO_2$ and Si.

The result of the measurement is shown in a graph of FIG. 14. As is apparent from FIG. 14, with an increasing of H2 gas flow being introduced, an etching rate of $SiO_2$ shown by curve a increased and an etching rate of Si shown by curve b decreased. Therefore, the selectivity of $SiO_2$ to Si was improved with the increase of $H_2$.

However, when more $H_2$ was introduced into the chamber, the etching of $SiO_2$ stopped. This occurred at a 18 sccm of $H_2$ gas flow, or when a mixture ratio of $H_2$ to the gas mixture $CF_4$ was about 47% because a polymer was formed on the surface of $SiO_2$ and Si. Therefore, according to this etching method, the gas mixture ratio of $CF_4$ and $H_2$, which can achieve enough selectivity, is very small. Moreover, the etching rate of $SiO_2$, or the selectivity, was decreased even with a small change in the gas mixture ratio. Therefore, it is very difficult to practically use this etching method.

An etching method having a large selectivity of $SiO_2$ to Si, by setting a pressure in a chamber less than $10^{-2}$ Torr, was disclosed in Electro Communication Society, SSP 79-69, p55, 1981. The conditions of this etching method were a 7-8 m Torr of etching gas pressure, a 20 sccm of $CF_4$ gas flow, and a changing $H_2$ flow so as to change the mixture ratio of $CF_4$ and $H_2$. The etching was made and the etching rate of $SiO_2$ and Si was measured as shown in FIG. 15. As is apparent from FIG. 15, if the $H_2$ gas is increased such that a mixture ratio of $H_2$ to the gas mixture of $CF_4$ and $H_2$ is 70%-100%, a high selective etching of $SiO_2$ to Si can be achieved.

However, in the conventional RIE method of etching $SiO_2$, if the selectivity of $SiO_2$ to Si becomes more than 30, the etching ratio in forming a small opening contact hole is rapidly decreased. This phenomenon is generally known as a micro-loading effect. The result of this phenomenon is that, if the etching is continued to form the small contact hole completely, another portion of the substrate on which a large contact hole is formed would be etched so as to also etch the underlying Si substrate.

Moreover, if a contact hole has a small opening and has a large aspect ratio, it is difficult to accurately form the small contact hole.

SUMMARY OF THE INVENTION

The present invention solves the problems discussed above. An object of the invention is to provide a dry etching method which can etch a material, such as an $SiO_2$ layer, without dependence on a size of patterns and with a high selectivity of etching the material to an underlying material, such as an Si substrate.

To attain the object of the invention, there is provided a dry etching method by plasma etching comprising the steps of forming a mask pattern on a silicon oxide layer with a maximum width of from 0.1 μm width to 1.0 μm, placing the silicon substrate into a reactive chamber having an etching gas introducing means; introducing an etching gas mixture of fluorocarbon gas and hydrogen gas such that a ratio of the hydrogen gas to the gas mixture is 50% to 80%; generating a plasma to plasma etch the silicon oxide layer according to the mask pattern to form an opening having an aspect ratio of more than 1 in the silicon oxide layer by using the plasma.

BRIEF DESCRIPTION OF THE DRAWINGS

Other objects and advantages of the invention will be apparent from the following description, taken in conjunction with the accompanying drawings, in which.

DETAILED DESCRIPTION OF THE PREFERRED EMBODIMENTS

Figure 1:
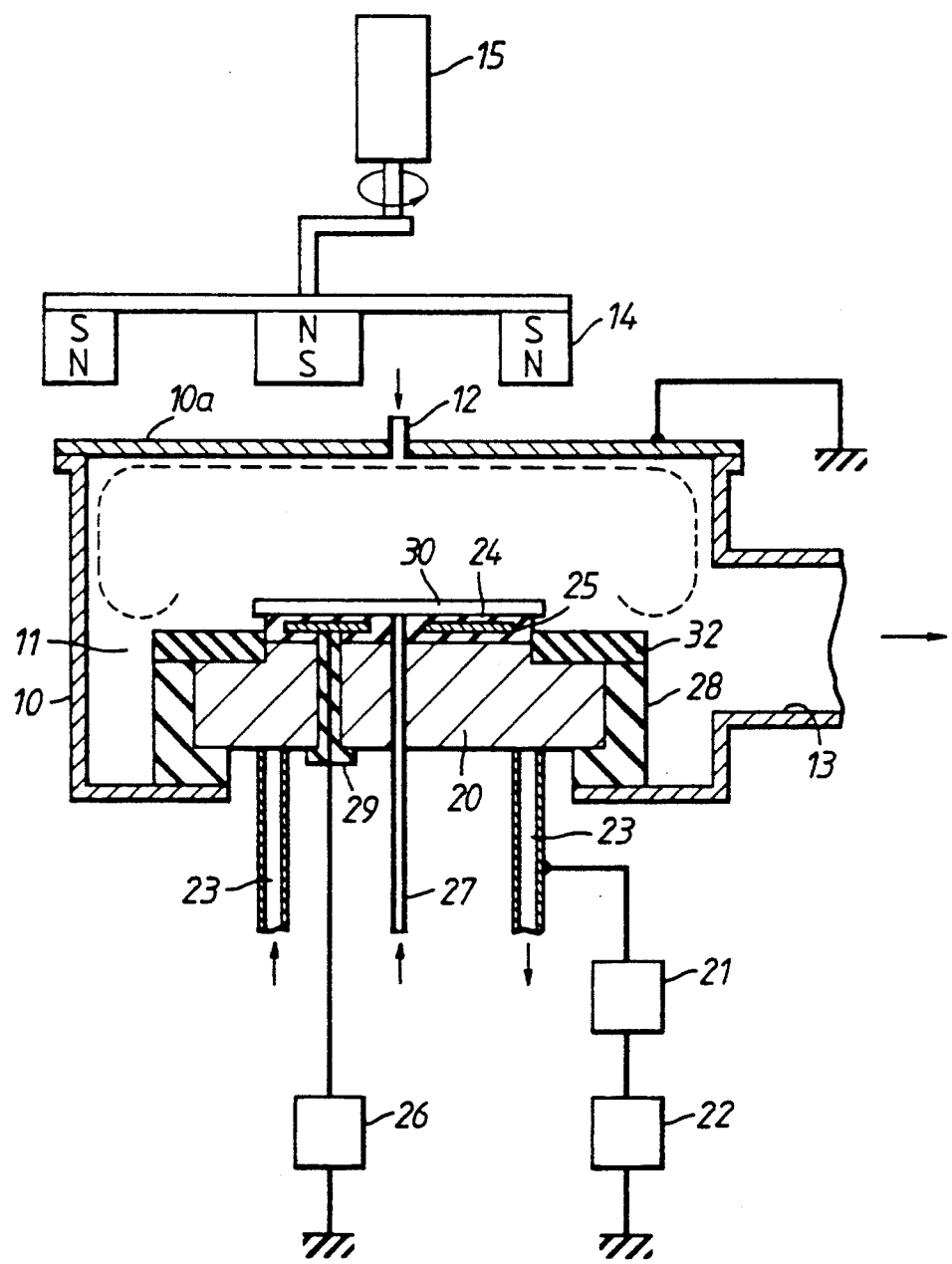
FIG. 1 is a sectional view of an etching apparatus used in the embodiments of the present invention.

Various experiments performed by the inventors will be explained to aide the description of embodiments of the present invention which solves the problem of micro-loading effect when an $H_2$ gas flow ratio to $CF_4$ gas is increased. The inventors found that if the $H_2$ gas flow ratio was increased so that the ratio of $H_2$ to the gas mixture goes over 50%, the etching rate was not decreased, even in etching a small contact hole or via hole having an opening of less than 1 $\mu m$.

For example, when a gas mixture such as $CF_4$ and $H_2$ was discharged, $CF_4$ was ionized to generate $CF_3$ radicals which are easy to stack on the surface layer of a material and also generate F radicals. $H_2$ also was ionized to generate H radicals. $CF_3$ was stacked on the surface of material, such as Si or $SiO_2$, and was dissociated into C and F by an ion damage of $CF_3^+$ accelerated by a self bias. C and F then reacted with Si or $SiO_2$. On the surface of $SiO_2$, a high vapor pressure of $SiH_4$ gas was generated by a reaction between Si and F, or a high vapor pressure of CO gas was generated by a reaction between C and 0. These gases, $SiH_4$ and CO were desorbed from the $SiO_2$ surface and thus the etching was accomplished.

A reaction between Si and F on the Si surface caused a high vapor pressure of $SiH_4$ gas to be desorbed. F contained in the remaining $CF_x$ (x=0–3) was extracted and the ratio C/F was increased so as to form a polymer on the surface of Si. The polymer suppressed the Si etching and contributed, therefore, to a selective etching of $SiO_2/Si$. H radicals dissociated from $H_2$ reacted with F radicals to form HF and increase the ratio of C/F. Moreover, the H radicals promoted to form a fluorocarbon polymer layer by extracting F from $CF_3$ stacked on Si. Therefore, when $H_2$ was added to $CF_4$, a selectivity of $SiO_2/Si$ was uniformly increased according to the effect of H extracting F.

On the other hand, when $H_2$ was not added the etching rate of $SiO_2$ was constant, being independent of the size of opening of the contact hole. Thus, when a small opening contact hole was etched, the selectivity of $SiO_2/Si$ was increased and the etching rate of $SiO_2$ was decreased because the etching rate was dependent on the size of the opening. This result occurred because a fluorocarbon polymer layer was easily formed as F was extracted from $CF_x$ by adding $H_2$ and the fluorocarbon polymer layer then was formed on $SiO_2$ at the bottom surface of the opening. Therefore, when the flow ratio of fluorocarbon gas and $H_2$ gas was less than 50%, which is the ratio conventionally used, a selectivity of more than 30 was obtained. However, the etching rate rapidly decreased when a contact hole having a small opening was etched.

However, the inventors of the present invention discovered that if the flow ratio of $H_2$ to gas mixture was increased to 50%–80%, and more desirably 57%–80%, the etching rate was not dependent on the size of the opening having a minimum of a 0.1 $\mu m$ width. The etching rate of $SiO_2$ was not decreased and an etching selectivity of $SiO_2/Si$ of more than 30 could be achieved.

The inventors discovered that if $H_2$ gas having a flow rate of more than 50% is added to the gas mixture, a large amount of H is produced, and F, from fluorocarbon gas, is extracted by H so as to produce $CF_x$ (x=0–2), which is likely to generate a polymerization reaction in an etching gas atmosphere or at the surface of Si. The possibility that $CF_x$ will adhere to the surface of Si is about 1, so most of $CF_x$ will be on the surface of Si. However, the amount of $CF_x$ adhesion changes with the configuration of the Si surface. For example, at the bottom of the contact hole, when the solid angle is small, the amount of adhesion decreased. Therefore, a wide fluorocarbon layer which suppresses the etching of Si will not form at the bottom of a contact hole. Therefore, if the gas flow ratio is more than 50%, the etching rate is not decreased in a small contact hole.

The upper limit of the gas flow ratio of less than 80% was determined as a function of the ability to obtain a high selectivity.

The inventors also determined that the angle of a side wall in the contact hole was relatively small, i.e. sloped, when an $H_2$ gas flow ratio of 50% was added. Moreover, when the $H_2$ gas flow ratio was more than 57%, the angle of the side wall became 90° against the surface of the substrate. Accordingly, if a $H_2$ gas flow ratio from 57% to 80% is applied, the angle of the side wall is improved and the accuracy of patterning is remarkable.

Using an $H_2$ gas flow ratio of 50% or greater also results in highly accurate patterning when a mask pattern including a large contact hole and a small contact hole having an opening of more than 0.1 μm and less than 1 μm and having an aspect ratio more than 1 or 2 was used can be remarkable. Moreover, when the gas pressure in the reactive chamber was set from 20 m Torr to 100 m Torr, sufficient etching selectivity was obtained. When the temperature of the substrate was set to less than 90° C., a fluorocarbon layer was formed on a side wall of a resist film and the angle of the side wall became small.

Moreover, when a magnetron gas plasma was used, which is generated by adding a magnetic field perpendicular to an electric field of the parallel plate electrodes, the high density of gas plasma was effectively caught between the plate electrodes. Therefore, an electrolytic dissociation was promoted to produce $CF_x$ radicals to increase the etching rate. This was an improvement over the RIE method that does not use a magnetic field.

Embodiments according to the present invention will be described in detail as below in view of the inventors' experiments and conclusions and the figures.

FIG. 1 shows a schematic sectional view of a dry etching apparatus. The etching apparatus uses a magnetron discharge and provides a vacuum chamber 10 to form a reactive chamber 11, an exhausting system 13 to vacuum the air in the chamber 10, and a gas introducing system 12. Chamber 10 has an upper electrode 10a as an anode or one of parallel plate electrodes. The anode 10a is a part of chamber 10 and is connected to ground. A lower electrode 20 as a cathode or another parallel electrode, opposed to anode 10b, is connected to a power supply 22 through a matching circuit 21 to apply a 13.56 MHz high frequency of electric power. Cathode 20 also is used as a sample holder and has a copper plate 25 wrapped by a polyimide layer 24 is formed thereon. A 4 kV voltage is applied to copper plate 25 to hold substrate 30 static-electrically on the surface of cathode 20. Thermal control system 23, to control the temperature of atmosphere in reactive chamber 11 such as a cooling tube, is provided in cathode 20.

A magnetic field generator comprising plural permanent magnets 14 and drive system 15 is provided over anode 10a to supply a magnetic field to the space between anode 10a and cathode 20. Gas introducing tube 23, to control thermal conductivity, is placed at the back side of cathode 20 and a first insulating material 28 to isolate cathode 20 from anode 10a or at vacuum chamber 10 and a second insulating material 29 to isolate lead 25a to copper plate 25 from cathode 20.

In this structure of the apparatus, a gas plasma is generated between parallel plate electrodes. This plasma attains a high density by applying the magnetic field from the permanent magnets 14, and the plasma includes various kinds of species, e.g., radicals or ions, produced from an etching gas. By using this plasma, a reactive ion etching of substrate 30 is performed.

A method of dry etching according to a first embodiment of the present invention, using the etching apparatus described above will now be explained.

Figure 2:
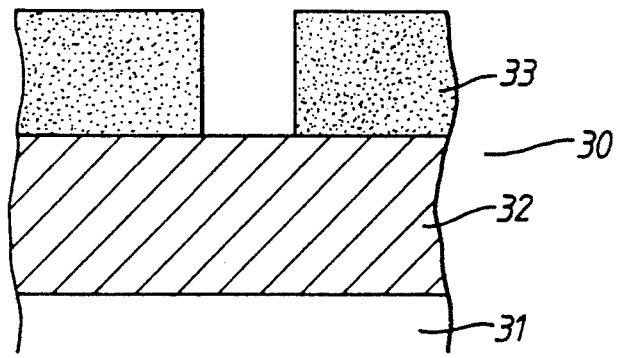
FIG. 2 is a sectional view of a substrate processed in the embodiment.

First, substrate 30 is prepared to be processed, as shown in FIG. 2. A 2 μm thick CVD (Chemical Vapor Deposition) silicon oxide layer 32 is formed on the whole surface of silicon substrate 31 and a resist pattern 33 is formed on the surface of CVD silicon oxide layer 32 by using a photo lithography. Resist pattern 33 has a 50 μm width opening.

Figure 3:
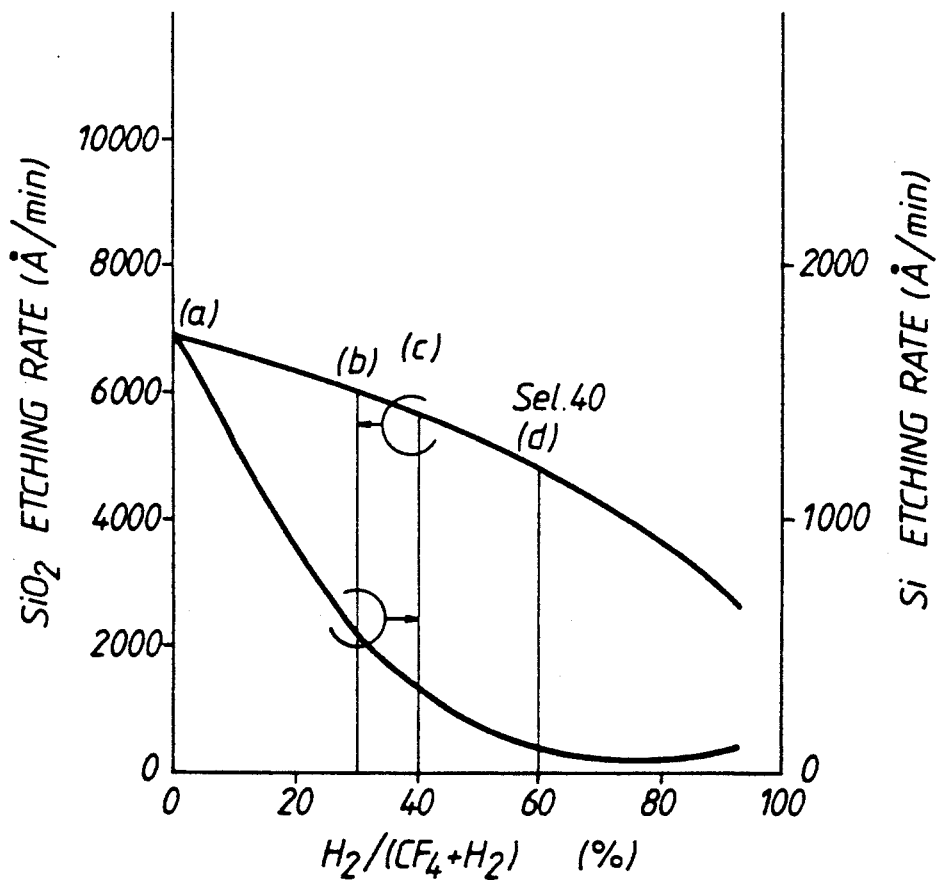
FIG. 3 is a first characteristic graph which shows a relationship between a gas flow ratio $H_2(CF_4+H_2)$ and an etching rate of silicon oxide and silicon.

Substrate 30 is placed on cathode 20 of the etching apparatus shown in FIG. 1 and an etching gas is introduced from gas introducing system 12 to etch substrate 30. A gas mixture of $CF_4$ gas and $H_2$ gas is used as the etching gas. The etching states of silicon oxide layer 32 obtained by experimental changes of flow rate are illustrated in FIG. 3. The horizontal axis in the graph shows a gas flow ratio of $H_2$, ($H_2/(H_2+CF_4)$) and the vertical axis at the right side and left side, respectively, show an etching rate of silicon and an etching rate of silicon oxide.

In the experiment, a 100 sccm (standard cubic centimeter per minute) of gas mixture of $CF_4$ and $H_2$ was used at a 40 m Torr gas pressure. An 800 W of RF electric power was supplied to cathode 20. A horizontal magnetic field was set to 100 Gauss.

As is apparent from FIG. 3, as the $H_2$ flow ratio becomes larger, the etching rate of silicon oxide slightly decreases. However, the etching rate of silicon rapidly decreases, depending on the $H_2$ flow rate. For example, the maximum selectivity of silicon oxide to silicon was 40 when the flow ratio of $H_2/(H_2+CF_4)$ was 60%. The selectivity of 30 was obtained when the flow ratio of $H_2/(H_2+CF_4)$ was 80%.

Figure 4:
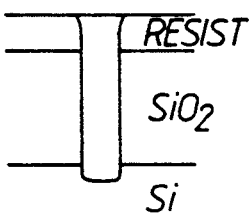
FIG. 4(a)-FIG. 4(d) are sectional views which show configurations of an opening after the etching under some variable conditions and FIG. 4(d) especially shows the configurations formed after the etching according to an embodiment of the present invention.

FIG. 4 shows sectional views of the silicon oxide layer, as a function of the gas flow ratio $H_2/(CF_4+H_2)$ Silicon substrates having a silicon oxide layer and a resist mask having 0.4 μm, 0.5 μm, and 1.2 μm width openings are illustrated. When a 100 sccm of $CF_4$, without adding $H_2$, i.e., $H_2/(CF_4+H_2)=0\%$ was used as shown in FIG. 4(a), 0.4 μm, 0.5 μm, and 1.2 μm opening widths were normally formed in the silicon oxide, but an underlying layer of silicon substrate was overetched. This result was the same when a polysilicon layer 31 was used.

When a 70 sccm of $CF_4$ and a 30 sccm of $H_2$, i.e., $H_2/(CF_4+H_2)=30\%$ was used as shown in FIG. 4(b), a 1.2 μm opening width was normally formed in silicon oxide by the etching, but a 0.4 μm and 0.5 μm opening width could not be etched to reach the surface of the polysilicon.

Moreover, when a 60 sccm of $CF_4$ and a 40 sccm of $H_2$, i.e., $H_2/(CF_4+H_2)=40\%$ was used as shown in FIG. 4(c), a 1.2 μm opening width was formed normally in silicon oxide by the etching. However, a 0.4 μm width of silicon oxide and a 0.5 μm width of silicon oxide could not be etched to reach the surface of the underlying polysilicon. A fluorocarbon polymer 34 was deposited at the bottom surface of the openings.

However, when a 40 sccm of $CF_4$ and a 60 sccm of $H_2$, i.e., $H_2/(CF_4+H_2)=60\%$, which is the embodiment of the present invention is used, as shown in FIG. 4(d), all of 0.4 μm, 0.5 μm and 1.2 μm widths of silicon oxide were normally etched.

Figure 5:
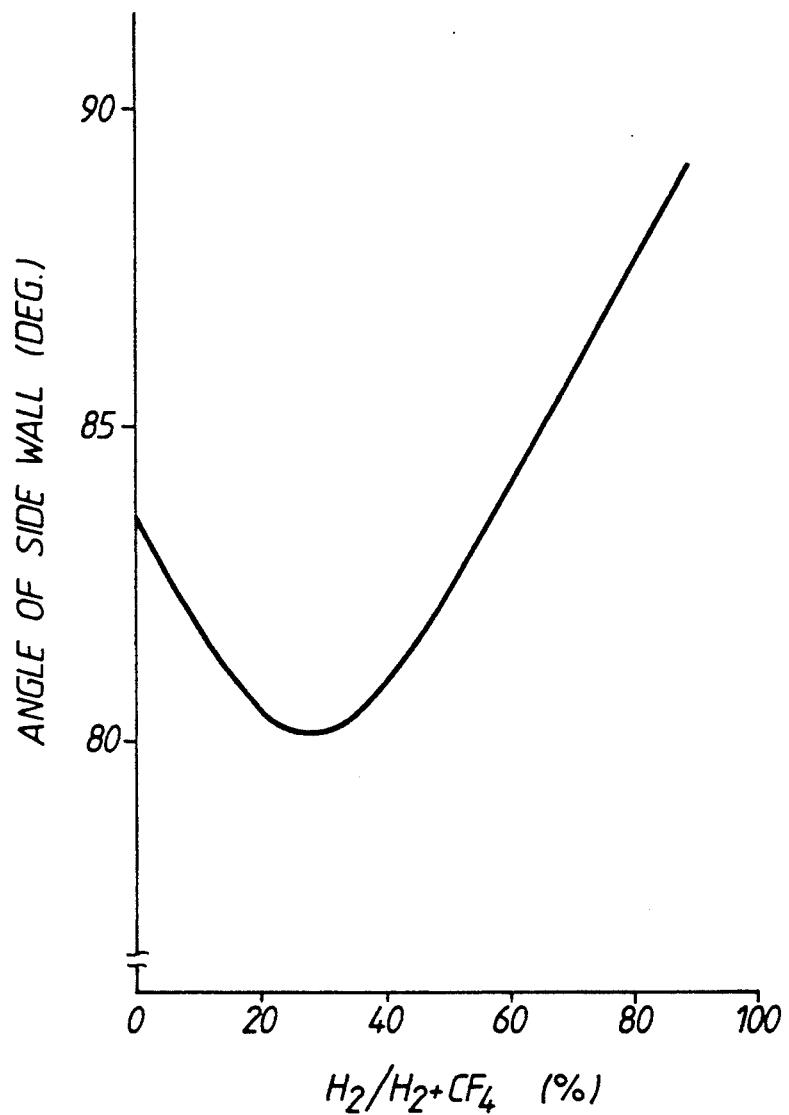
FIG. 5 is a second characteristic graph which shows a relationship between a gas flow ratio of $H_2/(CF_4+H_2)$ and an angle of the side wall of the opening against the surface of the substrate after silicon oxide is etched according to an embodiment of the present invention.

FIG. 5 is a graph showing an angle of the side wall of an opening having a 1.2 μm width in a silicon oxide after the etching method of an embodiment of the present invention. As shown, the angle of the side wall momentarily decreased with an increase of the $H_2$ flow ratio. However, if the $H_2$ gas flow ratio continued to increase, the angle of the side wall became larger. At the $H_2$ flow ratio of more than 57%, the sidewall angle became larger than that of the sidewall when no $H_2$ gas was added.

Figure 6:
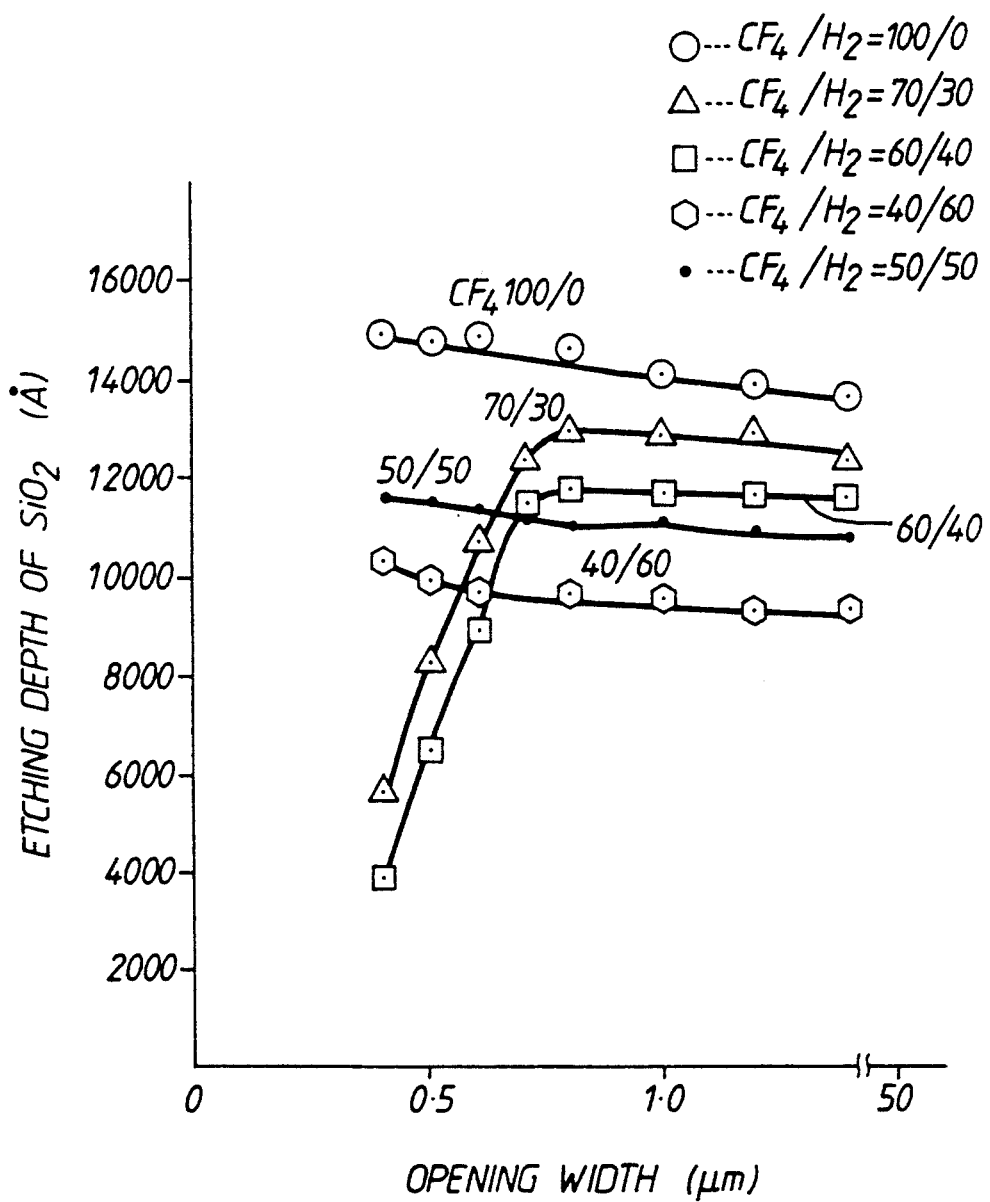
FIG. 6 and FIG. 7 are third and fourth characteristic graphs which show relationships between the size of the opening and the etching depth.

FIG. 6 is a graph showing the measured result of dependence of the etching depth against the width opening for a contact hole. The etching time was for 2 minutes. When 100% $CF_4$ gas without $H_2$ gas was used, the etching depth was not dependent on the size of opening, but an etching selectivity of only 5 was obtained. When 30% $H_2$ or 40% $H_2$ was added, the etching depth for a contact hole having a 0.4 μm opening width rapidly decreased compared to the rate to etch a contact hole having a 0.5 μm opening width. However, when an embodiment of the present invention was used, and the $H_2$ gas flow ratio was more than 50%, the etching rate was not dependent on the size of opening at all. Moreover, deviations of etching depth were within 10% from a 0.4 μm opening width to a 1.5 μm opening width. Thus, very uniform precise etching is possible with the present invention.

Figure 7:
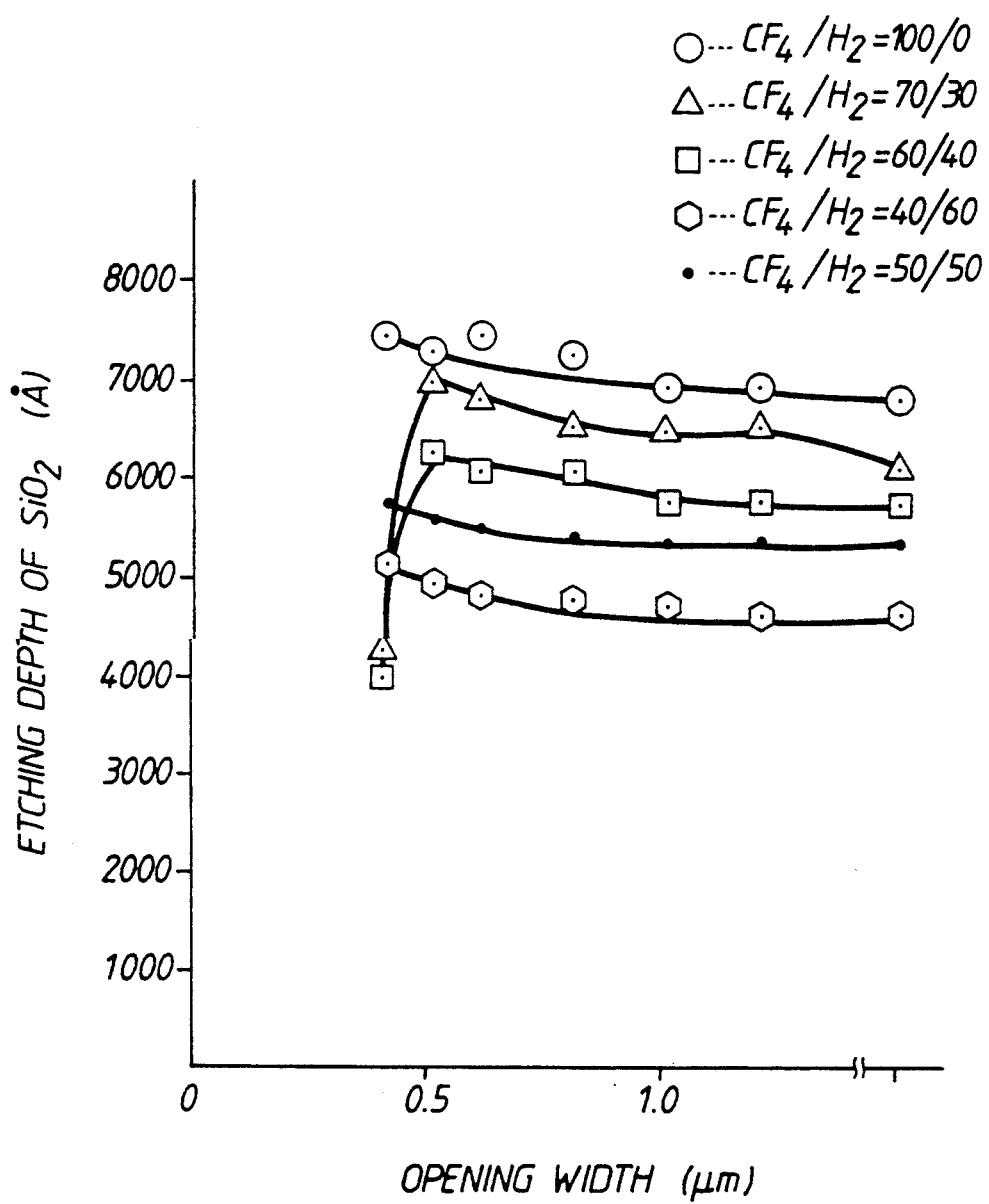

FIG. 7 is a graph showing the result of another experiment regarding the relationship between etching depth and opening width. The etching time was 1 minute. The results are quite similar to those obtained in FIG. 6. At an opening width of about 0.7 μm, the etching rate became dependent upon the amount of $H_2$ gas used (unless no $H_2$ was used). The embodiment of the invention illustrates that if more than 50% of the $H_2$ gas is used, the etching rate is not dependent on the width opening.

Figure 8:
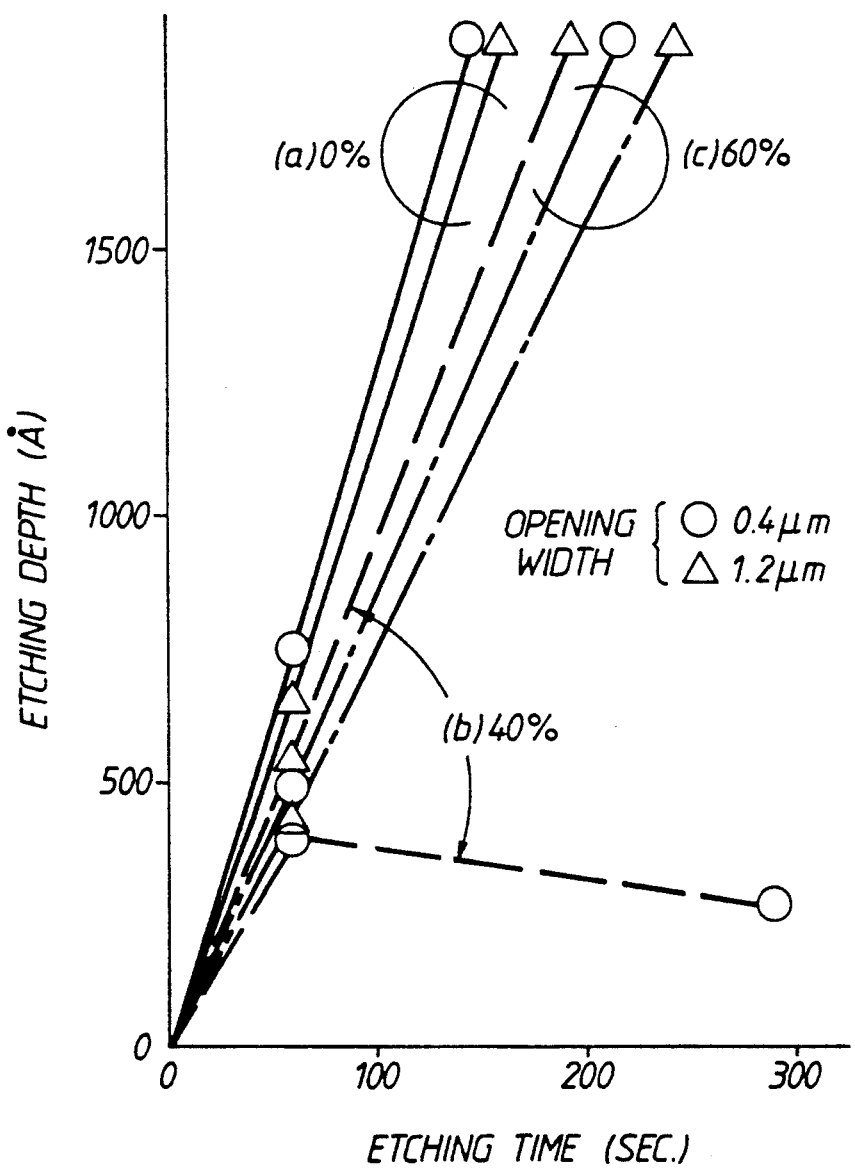
FIG. 8 is a fifth characteristic graph which shows a relationship between etching time and etching depth.

FIG. 8 shows a graph of the relationship between etching depth and etching time. When 100% $CF_4$ gas without $H_2$ gas was used (lines (a)), the etching depth was linear to the etching time without dependance on the width. Etching selectivity of 5 was obtained. When 60% of $CF_4$ gas and 40% of $H_2$ gas was used (lines (b)), the etching time for a depth of 0.4 μm opening dramatically increased. The etching selectivity according to this case was improved from 10 to 30 when the $H_2$ gas ratio was from 30% to 50%. When 40% of $CF_4$ and 60% of $H_2$ was used (lines (c)), the etching was linear to the etching time without dependence on the size of opening. A similar result was achieved when 50% of $CF_4$ and 50% of $H_2$ was used.

According to the results described above, when etching silicon oxide layer to silicon using a gas mixture of $CF_4$ and $H_2$ and a $H_2$ gas ratio from 50% to 80% is used, an accurate microminiaturizing pattern can be obtained without dependence on the size of the opening. If a proper angle of side wall of the pattern is required, an $H_2$ gas flow ratio must be from 57% to 80%.

Figure 9:
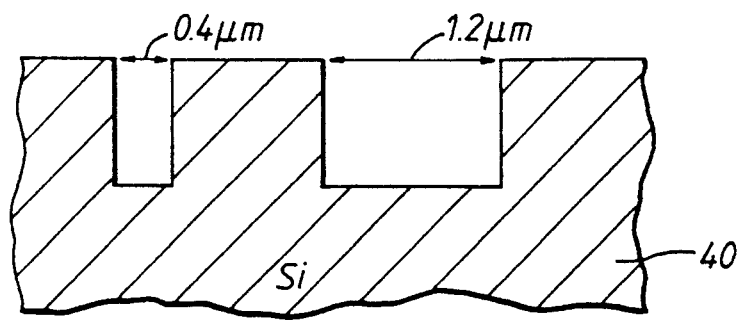
FIG. 9 is a sectional view of a substrate used in an embodiment of the present invention.

The effect of using additional $H_2$ gas was measured by using a sample 40 as shown in FIG. 9. Sample 40 was a silicon substrate having a 0.4 μm wide trench $T_1$ and a 1.2 μm wide trench $T_2$. The sample was then etched using different $H_2$ gas mixture ratios. The results of the various etchings are shown in FIGS. 10(a)-10(c).

Figure 10A:
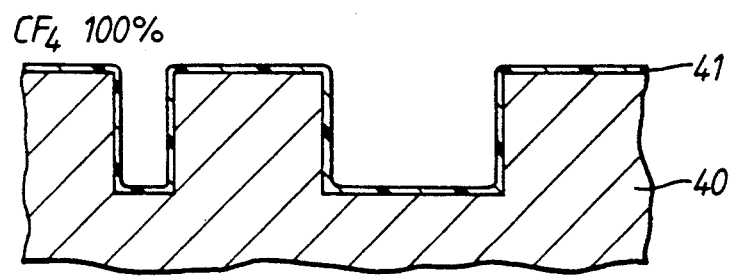
FIG. 10(a)-FIG. 10(c) are sectional views of a sample etched by the etching apparatus of FIG. 1.
Figure 10B:
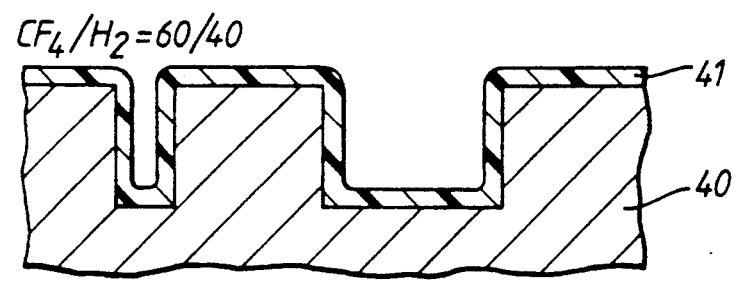
Figure 10C:
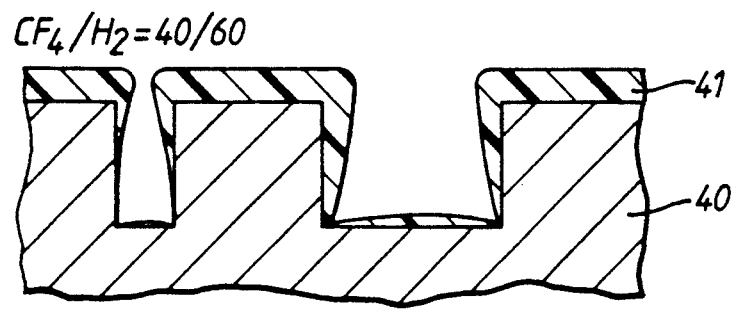

FIGS. 10(a)-10(c) show sectional views of the sample placed on anode electrode 10a of the etching apparatus shown in FIG. 1. A fluorocarbon layer 41 is formed on the surface of the sample 40. A characteristic of the plasma generated by the etching apparatus could be examined without influence from ion damage.

As shown in FIG. 10(a), when 100% of $CF_4$ gas without $H_2$ gas was used, the amount of polymer 41 deposited was very thin and the polymer 41 was uniformly deposited on the sidewalls and in the contact holes.

When 60% of $CF_4$ and 40% of $H_2$ was used, as shown in FIG. 10(b), the configuration of the deposition did not change, but the amount of the deposition increased.

When 40% of $CF_4$ and 60% of $H_2$ was used, as shown in FIG. 10(c), the amount of polymer 41a deposited increased but the thickness of the polymer 41a at the bottom portion of the contact holes became thinner than that of other portions. Moreover, in the smaller sized contact hole (the 0.4 μm opening) the thickness of the polymer was thinner. Even on the cathode electrode 20a a fluorocarbon polymer layer would be deposited on the substrate in a similar manner.

These results are explained as follows. When 60% of $H_2$ is used, fluorocarbon polymer 41b is easy to deposit on the upper edges of the openings because the C/F ratio in a fluorocarbon particle $CF_x$ is increased by an additional $H_2$ gas and the polymer becomes thicker.

Conversely, when 60% of $H_2$ is added, a ratio of fluorocarbon particles ($CF_x$) to reach to the surface of the lower substrate 40 is dependent on the configuration. The amount of the particle to reach the bottom surface of the contact hole decreases and the polymer 41b is not formed thickly at the bottom surface. Accordingly, the silicon etching is suppressed at the bottom surface of the contact hole having a small opening.

With an increase of $H_2$ to $CF_4$, a fluorocarbon polymer is likely to form because H dissociated in the plasma reacts with F to form HF, and the C/F ratio also is increased. Accordingly, the selectivity to silicon is increased but the etching at a small contact hole is suppressed so as to stop the etching. When the $H_2$ gas flow ratio becomes more than 50%, F in $CF_x$ is increasingly extracted by H radicals and fluorocarbon particles having a higher C/F ratio are increased. Thus, the polymers will stick on the surface of the substrate, and the fluorocarbon layer is hardly formed in the contact hole.

Accordingly, the angle of the side wall of the contact hole becomes larger, and the etching is not prevented, even if the contact hole has a small opening. As a result, when the $H_2$ gas flow ratio is more than 50%, the etching rate for silicon oxide is not dependent on the size of contact hole.

Figure 11:
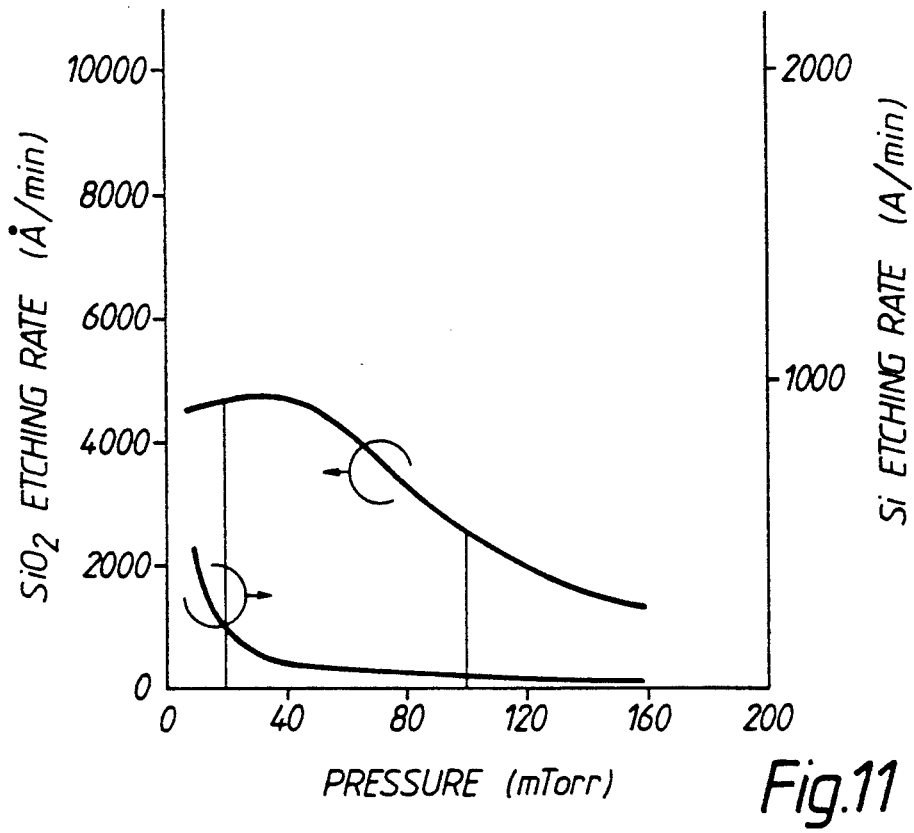
FIG. 11 is a sixth characteristic graph which shows a relationship between gas pressure and the etching rate of silicon oxide.

The effect of etching gas pressure on the etching character will now be explained. FIG. 11 shows a graph of the relationship between the etching gas pressure and the etching rate. A 40 sccm of $CF_4$ and a 60 sccm of $H_2$ were used as the etching gas. The etching rate of $SiO_2$ was slightly increased with the increase of the pressure and had a peak at 40 m Torr. As the pressure further increased, the etching rate decreased to ½ of the maximum etching rate. In contrast to this, the etching rate of silicon uniformly decreased. Accordingly, within from 20 m Torr to 100 m Torr of pressure, a satisfactory etching rate and a selectivity to silicon of more than 25 was obtained.

Figure 12:
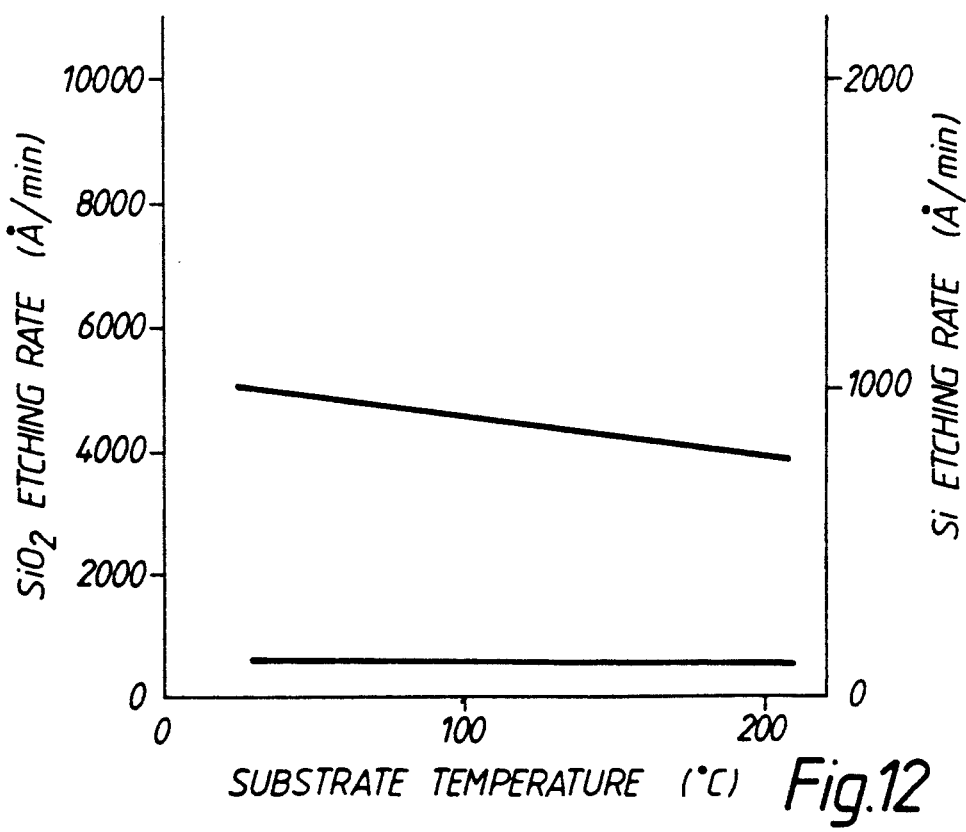
FIG. 12 is a seventh characteristic graph which shows a relationship between temperature of the substrate and etching rates of silicon oxide and silicon.

The effect of substrate temperature on the etching characteristic will be explained below. FIG. 12 shows a graph of the relationship between the temperature and the etching rate of silicon and silicon oxide. A 40 sccm of $CF_4$ gas and a 60 sccm of $H_2$ gas were used and the gas pressure was set to 40 m Torr. The etching rate of $SiO_2$ slightly decreased with an increase of the temperature, but the dependability on the temperature was small. Also, the etching rate of silicon was not dependent on the temperature, and the etching selectivity was almost unchanged.

Figure 13A:
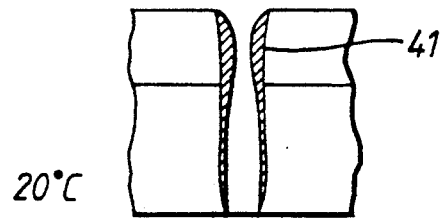
FIG. 13(a)-FIG. 13(c) are eighth characteristic graphs which show configurations after etching under various conditions of temperature.
Figure 13B:
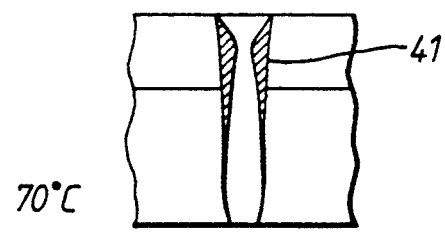
Figure 13C:
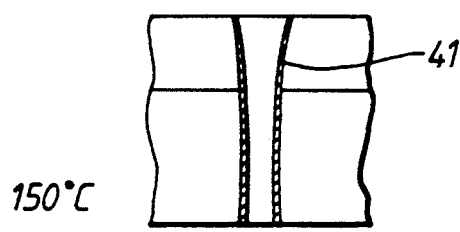
Figure 14:
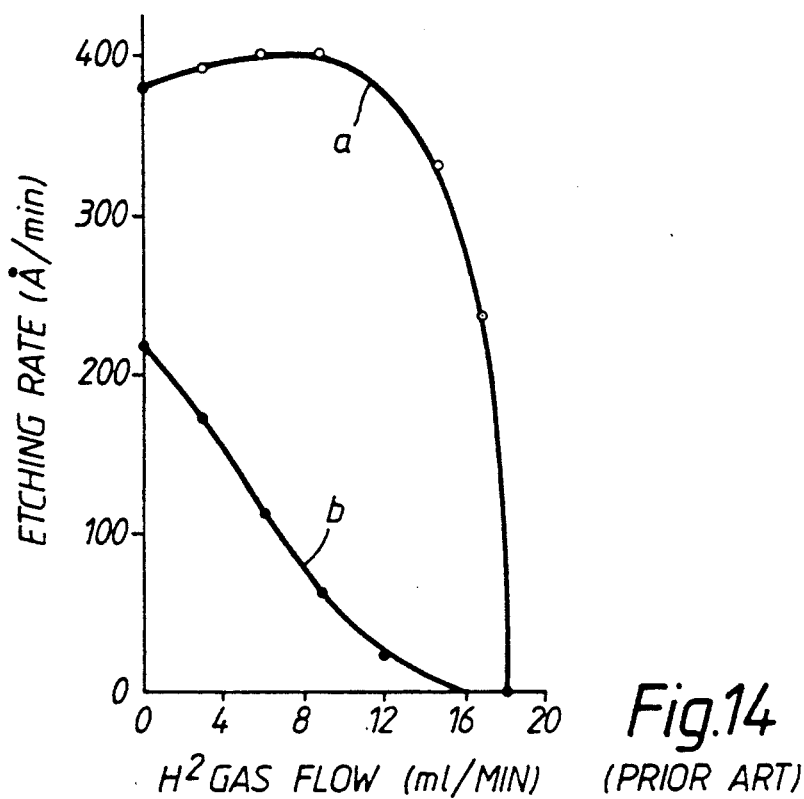
FIG. 14 and FIG. 15 are characteristic graphs to explain a conventional etching method.
Figure 15:
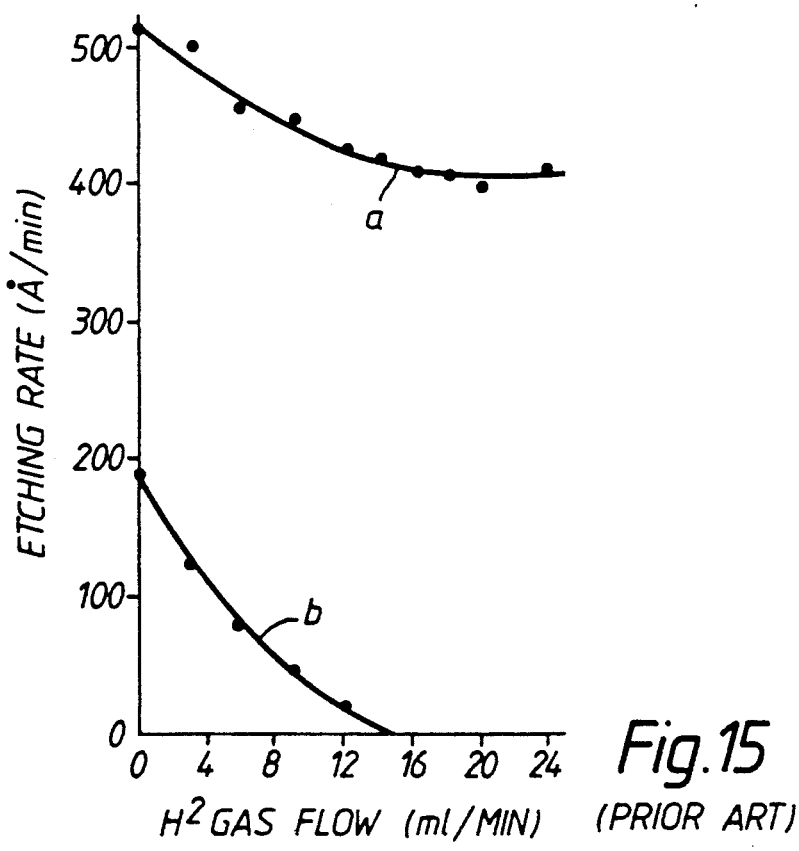

Configurations of the contact hole after the etching, as a function of the temperature, is illustrated in FIG. 13. FIG. 13(a)-FIG. 13(c), respectively, show configurations of a contact hole having a 0.4 μm width of opening for 20° C., 70° C., and 150° C. of the substrate temperature.

As shown in FIG. 13(a) and FIG. 13(b), the silicon oxide layer's side wall angle decreased during etching at the temperature of 20° C. or 70° C. This is because polymer is deposited on the side wall of the mask, e.g., a resist film and a mask size essentially decreased during etching.

In contrast, at a temperature of 150° C., as shown in FIG. 13(c), a thick deposition of the polymer on the side wall of the resist was not observed, and the angle of the side wall of silicon oxide did not decrease. This is because the amount of fluorocarbon to be deposited was changed by the temperature of the substrate and the amount decreased with an increase in the temperature.

Accordingly, if the temperature of a substrate is controlled to more than 90° C., a desired etching without a rapid decrease of the side wall angle of silicon oxide during the etching is possible. According to a preferred embodiment, the temperature of the substrate is below 180° C., considering a process using a resist film. In the embodiment described above, the opening width is more than 0.1 μm to compensate for scattering by incident ions from a plasma.

According to a preferred embodiment of the present invention, a fluorocarbon, ($CF_x$) plays a very important role in realizing the high selective and accurate etching. The configurations of the polymer can be controlled by adding an $O_2$ gas or an $N_2$ gas to the etching gas, such as $CF_4$ and $H_2$. C in $CF_x$ reacts with O or N of the additional gas to form C-O or C-N. Accordingly, the $O_2$ or $N_2$ gas could be used to etch the polymer for the purpose of controlling the selective etching of silicon oxide to silicon.

It will be apparent to those skilled in the art that modifications and variations can be made to the dry etching method of the present invention. The invention in its broader aspects is, therefore, not limited to the specific details, representative methods and apparatus, and illustrated examples shown and described herein. Thus, it is intended that all matter contained in the foregoing description and shown in the accompanying drawings, shall be interpreted as illustrative and not in a limiting sense.

We claim:

1. A dry etching method by a plasma etching comprising the steps of:
   providing a silicon substrate having a silicon oxide layer thereon;
   forming a mask pattern on the silicon oxide layer with a maximum width opening of 1 μm;
   placing the silicon substrate into a reactive chamber having an etching gas introducing means;
   introducing an etching gas mixture of fluorocarbon gas and hydrogen gas such that a ratio of the hydrogen gas to the gas mixture is 50% to 80%; and
   generating a plasma within the reactive chamber to plasma etch the silicon oxide layer according to the mask pattern to form an opening having an aspect ratio of at least 1.

2. The dry etching method according to claim 1 wherein the ratio of the hydrogen gas to the gas mixture is 57% to 70%.

3. The dry etching method according to claim 1 further comprising the step of controlling a gas pressure in the reactive chamber from 20 m Torr to 100 m Torr.

4. The dry etching method according to claim 1 further comprising the step of controlling a temperature of the silicon substrate to a minimum of 90° C.

5. A dry etching method to form a window having a bottom in a silicon oxide layer comprising the steps of:
   providing a silicon substrate having a silicon oxide layer;
   forming a mask pattern on the silicon oxide layer with a maximum width opening of 1 μm;
   placing the silicon substrate into a reactive chamber having an etching gas introducing means;
   introducing a gas mixture of fluorocarbon gas and hydrogen gas;
   dissociating the gas mixture to produce $CF_x$ (x: $0 \leq x \leq 2$) polymers;
   etching the silicon oxide layer selectively to the silicon substrate according to the mask pattern; and
   suppressing a formation of the polymers at the bottom of the silicon oxide layer.

6. A dry etching method by a plasma etching comprising the steps of:
   providing a silicon material having a silicon oxide layer thereon;
   forming a mask pattern on the silicon oxide layer with a maximum width opening of 1 μm;
   placing the material into a reactive chamber having an etching gas introducing means;
   introducing fluorocarbon gas and hydrogen gas;
   generating a plasma within the reactive chamber to plasma etch the silicon oxide layer selectively to the silicon material according to the mask pattern such that, as a ratio of the hydrogen gas to the fluorocarbon gas is increased beyond a ratio wherein an etching depth of the silicon oxide rapidly decreases, a ratio of the etching depth of the silicon oxide to an opening width is within 10%.

7. A dry etching method according to claim 6, wherein the ratio of the hydrogen gas to the fluorocarbon gas is increased beyond a ratio wherein an etching depth of the silicon oxide rapidly decreases such that the ratio of the etching depth to the opening width depth is within 10% and the opening width is less than a first width.

8. A dry etching method according to claim 7, wherein the mask pattern has a plurality of openings, at least one opening having a smaller width than the first width and at least one opening having a greater width than the first width.

9. A dry etching method to form a window having a bottom in a silicon oxide layer comprising the steps of:
   providing a silicon substrate having a silicon oxide layer;
   forming a mask pattern on the silicon oxide layer with a maximum width opening of 1 μm;
   placing the silicon substrate into a reactive chamber having an etching gas introducing means;
   introducing a gas compound containing carbon, fluorine and hydrogen;
   dissociating the gas compound to produce $CF_x$ (x: $0 \leq x \leq 2$) polymers;
   etching the silicon oxide layer selectively to the silicon substrate according to the mask pattern; and
   suppressing a formation of the polymers at the bottom of the silicon oxide layer.

* * * * *